United States Patent [19]
Choi

[11] Patent Number: 5,943,262
[45] Date of Patent: Aug. 24, 1999

[54] NON-VOLATILE MEMORY DEVICE AND METHOD FOR OPERATING AND FABRICATING THE SAME

[75] Inventor: Jeong-Hyuk Choi, Suwon-shi, Rep. of Korea

[73] Assignee: Samsung Electronics Co., Ltd., Rep. of Korea

[21] Appl. No.: 09/181,248

[22] Filed: Oct. 28, 1998

[30] Foreign Application Priority Data

Dec. 31, 1997 [KR] Rep. of Korea ..................... 97-80524

[51] Int. Cl.⁶ .................................................. G11C 16/04
[52] U.S. Cl. ............................... 365/185.17; 365/185.18; 365/185.24; 365/185.28; 365/185.33
[58] Field of Search .......................... 365/185.17, 185.18, 365/185.26, 185.28, 185.24, 185.29, 185.33, 218

[56] References Cited

U.S. PATENT DOCUMENTS

| | | | |
|---|---|---|---|
| 4,698,787 | 10/1987 | Mukherjee et al. | 365/185.33 |
| 4,888,734 | 12/1989 | Lee et al. | 365/185.33 |
| 5,491,657 | 2/1996 | Haddad et al. | 365/185.18 |
| 5,596,523 | 1/1997 | Endoh et al. | 365/185.28 |
| 5,638,327 | 6/1997 | Dallabora et al. | 365/185.33 |
| 5,790,456 | 8/1998 | Haddad | 365/185.18 |
| 5,812,454 | 9/1998 | Choi | 365/185.33 |
| 5,877,524 | 3/1999 | Oonakado et al. | 365/185.18 |

*Primary Examiner*—Trong Phan
*Attorney, Agent, or Firm*—Lappin & Kusmer LLP

[57] ABSTRACT

A non-volatile memory device includes a plurality of bit lines arranged in parallel at predetermined intervals, a plurality of word lines arranged perpendicularly to the bit lines and at predetermined intervals, a plurality of unit cells having a stacked gate structure comprising a floating gate and a control gate formed in regions where the bit lines and word lines perpendicularly intersect, a plurality of source lines parallel to the bit lines for connecting source active regions of cells to one another, the source active regions being shared by two symmetrical cells connected to an identical bit line through different bit line contacts, and source select transistors formed in overlap regions between source lines and word lines, for dividing the source active regions. For programming a cell, a cell current is generated by applying a positive voltage to a bit line and a word line of the selected cell and a reference voltage lower than the bit line voltage to a source line, and a voltage lower than the reference voltage is applied to a word line of an unselected cell sharing the source active region with the selected cell. Therefore, the limitations of overerasure can be avoided in a device which occupies the same cell area as that of conventional cell arrays.

17 Claims, 20 Drawing Sheets

NON-VOLATILE MEMORY DEVICE AND METHOD FOR OPERATING AND FABRICATING THE SAME

BACKGROUND OF THE INVENTION

Semiconductor memory devices largely comprise RAMs (Random Access Memories) and ROMs (Read Only Memories). RAM is referred to as volatile memory, in that when supply voltage is removed, data is destroyed with the passage of time. RAM devices, including DRAMs (Dynamic RAMs) and SRAMs (Static RAMs), generally allow for relatively rapid data storage and retrieval. ROM devices, including PROMs (Programmable ROMs), EPROMs (Erasable PROMs), and EEPROMs (Electrically EPROMs) are non-volatile, in that they retain data once it is entered regardless of whether voltage is removed; however, data storage and retrieval in ROM is relatively slow. Demand for EEPROMs, which can electrically program and erase data, is increasing. Such EEPROM cells, or flash memory cells whose contents can be simultaneously erased, are characterized by a stacked gate structure comprising a floating gate and a control gate.

Flash memory cells are generally grouped into NAND type and NOR type circuits NAND type flash memory, in which a unit string is composed of n cell transistors connected in series and such unit strings are connected in parallel between bit lines and ground lines, is useful in realizing high integration. The NOR type, in which respective cell transistors are connected in parallel between bit lines and ground lines, offers high-speed operation. The structure and operation of a basic NOR flash memory cell, disclosed in U.S. Pat. No. 4,698,787 and incorporated herein by reference, is now described with reference to FIGS. 1, 2, and 3.

FIG. 1 is a partial layout diagram of a cell array in a NOR flash memory device, FIG. 2 is an equivalent circuit diagram of the cell array, and FIG. 3 is a vertical sectional view of a unit cell. Referring to FIG. 3, reference numeral 10 denotes a semiconductor substrate, reference numeral 12 denotes a tunnel oxide film, reference numeral 14 denotes a floating gate, reference numeral 16 denotes an interpoly dielectric layer, reference numeral 18 denotes a control gate, reference numerals 20 and 22 denote source/drain regions of the unit cell, respectively, and reference numeral 24 denotes a bit line contact.

Referring to FIGS. 1, 2, and 3, a unit cell is formed in a stacked gate structure comprising a floating gate 14 and a control gate 18 in an area where a word line W/L perpendicularly intersects a bit line B/L, the word and bit lines themselves comprising a metal layer. A plurality of cells are configured in cell arrays, each array including a plurality of bit lines B/Ls, word lines W/Ls, and source lines CSLs, arranged in predetermined intervals. Two cells are connected to a bit line B/L through a bit line contact 24, and source regions of respective cells, comprising impurity diffusion layers parallel to a word line W/L, are connected by a source line CSL, provided every few bits, and disposed in parallel with the bit lines B/L.

In the unit cell shown in FIG. 3, the tunnel oxide film 12 is interposed between the floating gate 14 and the substrate 10, and the interpoly dielectric layer 16 is interposed between the floating gate 14 and the control gate 18 provided as a word line W/L. Further, the source/drain regions 20 and 22 are formed in self-alignment with the stacked gate. The floating gate 14 extends across an active region and portions of edges of field regions at both sides of the active region, thus being isolated from a floating gate 14 of an adjacent cell. The control gate 18 is connected to that of an adjacent cell, forming a word line W/L.

Adjacent cells are formed in opposite directions, sharing the source/drain regions 20 and 22. The drain region 22 of the unit cell is connected with that of an adjacent cell in the same column, and has the bit line contact 24 formed therein. Bit line contacts 24 are electrically connected by a bit line B/L perpendicular to a word line W/L. That is, two cells are connected to a bit line B/L through one bit line contact 24.

The source region 20 of the unit cell is connected to that of an adjacent cell in the same column through a source active region comprising an impurity diffusion layer parallel to a word line W/L. To reduce the resistance of the source line CSL, a source line contact is formed for every plurality of bit lines, in the source active region parallel to the word line W/L. The source line CSL parallel to the bit line B/L is electrically connected to the source active region via the source line contact.

Programming and erasing of the above NOR flash memory cells are based on injection of channel hot electrons (CHEs) and Fowler-Nordheim tunneling through a source or a bulk substrate, respectively.

For a programming operation, the threshold voltage Vth of the cell is raised from an initial level of about 2 V, to a level of about 7 V by storing electrons on a floating gate. That is, by applying 6–7 V to a selected bit line, 10–12 V to a selected word line used as a control gate, and 0 V to a source and a substrate, part of the CHEs are injected onto the floating gate through a tunnel oxide film due to a gate field, and thus the cell is programmed.

For an erasing operation, the threshold voltage Vth is dropped to the initial level of about 2 V, by discharging electrons from the floating gate. That is, by floating the selected bit line, and by applying 12–15 V to the source and 0 V to the selected word line, the electrons tunnel according to the Fowler-Nordheim effect from the floating gate to a source junction, through the tunnel oxide film of approximately 100 Å in thickness, due to the voltage difference between the floating gate and the source junction, and thus the cell is erased. The erasing operation is implemented by a simultaneous block erase technique, that is, by simultaneously erasing hundreds or thousands of bits including multiple word lines and bit lines as a block.

A reading operation refers to determining the absence or presence of a current path through erased and programmed cells by applying approximately 1 V to the selected bit line and 4–5 V to a word line.

The source line CSL operates to inject a large amount of current across the cell to a ground node during programming and reading. In a flash memory cell relying on CHE injection, a source line is formed for every eight or sixteen cells to rapidly discharge a large amount of current.

A drawback of the thus-constituted NOR flash memory device is overerasure-induced disturbance. Overerasure indicates that the erase threshold voltage of a specific cell drops to or below 0 V (a normal erase threshold voltage is 2 V) because process defects in a unit cell or degradation of the tunnel oxide film varies the tunneling field. Generally, a selected cell should be programmed by injecting current only through the selected cell connected to a selected bit line receiving a 6 V programming voltage and a selected word line receiving 12 V. However, in the presence of an over-erased cell on an unselected word line held at 0 V, a bit line voltage is discharged through the unselected cell due to the threshold voltage of 0 V or below, thereby reducing the amount of current across the selected cell. As a result, generation of CHEs required for programming of the cell is suppressed and the selected cell fails to be programmed. Furthermore, during a reading operation, an abnormal current path through the unselected overerased cell may lead to the false reading that the selected programmed cell is overerased.

To circumvent this overerasure problem, a NOR flash memory cell is disclosed in U.S. Pat. No. 4,888,734, incorporated herein by reference, wherein a source select transistor is formed between a source line and a source active region. FIG. 4 is a layout diagram of such a cell and FIG. 5 is an equivalent circuit diagram of the cell shown in FIG. 4.

Referring to FIGS. 4 and 5, a source active region 66 of the cell is separated by a source select transistor formed in an overlap area of a source line CSL and a word line W/L so that even if an unselected cell is overerased, the threshold voltage of the source select transistor is maintained at 0 V or higher and the programming and erase voltages of an unselected word line is 0 V. Thus, the conventional overerasure problem is alleviated to some degree, without increasing the area of the cell.

However, because two symmetrical cells (e.g., cell A and cell B in FIG. 5) connected to the same bit line B/L through different bit line contacts 64 share a single source active region 66, possible overerasing of a symmetrical cell sharing the source active region 66 with the cell of a selected word line produces a current path through the overerased cell, resulting in the aforementioned problems.

The following is a detailed description of erasing, programming, and reading operations of the above cell in connection with FIG. 5.

To erase the cell, the threshold voltage of the cell is lowered to approximately 2 V by applying an erase voltage of 12 V to a bit line and 0 V to a gate, thus removing electrons from a floating gate to a drain region via an electric field between a drain and the floating gate.

To describe a programming operation, cell A is taken as an example. A current flows through cell A by applying 6 V to a bit line B/L A, 12 V to a gate, and 0 V to a source and a bulk substrate, and a portion of the CHEs generated by a horizontal field at the drain region are injected onto the floating gate by a vertical field to the gate. In this manner, the threshold voltage of the cell is increased to 7 V or higher. When cell C is overerased, a voltage of 0 V on an unselected word line W/L C prevents a source select transistor C from being activated. Hence, no current path is formed from cell C to the source line CSL, with CSL being a ground node. On the other hand, when cell B is overerased, a bit line current across cell B flows not through a source select transistor B on a word line W/L B held at 0 V, but instead through a source select transistor A sharing the source active region 66. Because of an unintended current path through the unselected cell during a programming operation, current does not flow sufficiently across the selected cell, thereby failing to program the cell.

Reading of a cell is achieved by applying approximately 1 V to a selected bit line and 4–5 V to a selected word line and determining the programmed and erased states of a cell from turn-on and turn-off currents of the cell. When cell B is overerased during the reading of cell A, a current path is generated across cell B with the voltage 0 V on an unselected word line, and thus the selected cell A is misread as an overerased cell.

Another layout cell structure to address the above overerasure problem is disclosed in U.S. Pat. No. 4,888,734, and illustrated in FIG. 6.

Referring to FIG. 6, an independent source select gate line 68 is formed to isolate two cells from each other, which share an identical source active region and are connected to the same bit line B/L through different bit line contacts 64. Since the source select gate line 68 blocks formation of a current path through a source select transistor for another cell sharing the source active region, the above overerasure problem is mitigated. Yet, the entire cell area is increased by the source select gate line 68, making it difficult to realize high integration.

The NOR flash memory cell disclosed in U.S. Pat. No. 4,888,734 exhibits shortcomings which are now described with reference to FIGS. 7A, 7B, and 7C, which are vertical sectional views of FIG. 4, taken along lines a—a', b—b', and c—c', respectively. The problems are manifested when a stacked gate process is performed by self-aligned etching to form a floating gate 54 and a control gate 58 without misalignment.

Referring to FIGS. 7A, 7B, and 7C, a tunnel oxide film 52 is formed on a semiconductor substrate 50 having a field oxide film 51 formed thereon, and a first polysilicon layer 54 for a floating gate is formed on the tunnel oxide film 52. Floating gates of respective cells are isolated from one another by etching the polysilicon layer 54 on the field oxide film 51 by photolithography. Subsequently, an interpoly dielectric later 56 is formed on the resultant structure and a second polysilicon layer 58 for a control gate is formed on the interpoly dielectric layer 56. After a photoresist pattern 59 is formed on the second polysilicon layer 58 to form a word line, a stacked gate is formed by sequentially etching the second polysilicon layer 58, the interpoly dielectric layer 56, and the first polysilicon layer 54 using the photoresist pattern 59 as an etching mask. The space between floating gates 54 corresponds to a portion of the field oxide film 51. The exposed field oxide film 51 may be etched during etching of the floating gate 54, but this is not likely, as etch selectivity with polysilicon and oxide is generally excellent in a dry etching process.

However, for formation of a source select transistor having a MOS single-layer gate structure in a cell array of a stacked gate structure, the first polysilicon layer 54 for a floating gate is not formed on a source active region because only the control gate 58 acts as the gate of the source select transistor. Hence, when the first polysilicon layer 54 for a floating gate is etched after self-aligned etching of the second polysilicon layer 58 for a control gate and the interpoly dielectric layer 56, source/drain active regions 60 and 62 of the exposed source select transistor are likewise etched at the same etch rate and are therefore damaged (see FIG. 7C).

Further, when a source select gate line is to be formed in the cell, use of a high-voltage source erase method (i.e., applying 0 V to a gate and an erase voltage to a source) impedes an erase voltage applied to a source line from transferring to a source active region because the voltage on a selected word line is 0 V, lower than the threshold voltage of the source select transistor. Therefore, to solve this problem, a high-voltage drain erase method (i.e., applying 0 V to the gate and an erase voltage to a drain) is used instead, and the drain is formed to be a double diffused (DD) junction structure so that the bit line junction is not destroyed at 10 V or higher and leakage current is suppressed. As a result, generation of hot electrons is suppressed and programming efficiency is reduced, as compared to a general cell having a drain of an abrupt junction for CHE injection programming. In addition, if a drain acts as both programming and erase junctions, a tunnel oxide film may be rapidly degraded at a drain region due to injection and removal of electrons into and from the drain region.

SUMMARY OF THE INVENTION

The present invention relates to a non-volatile memory device and a method for operating and fabricating the same. In particular, the present invention is directed to a NOR flash memory device employing a stacked gate structure comprising a floating gate and a control gate, and a method for operating and fabricating the same in a manner which addresses the aforementioned limitations of conventional techniques.

An object of the present invention is to provide a non-volatile memory device, and a method of operating and forming same, which avoids an overerasure problem using a source select transistor, having the same or less area as a conventional cell array.

To achieve the above object, the present invention provides, in a first aspect, a method of operating a non-volatile memory device. The non-volatile memory device has a plurality of bit lines arranged in parallel in predetermined intervals, a plurality of word lines arranged perpendicularly to the bit lines and in predetermined intervals, a unit cell having a stacked gate structure comprising a floating gate and a control gate and formed in an area where a bit line perpendicularly intersects a word line, a plurality of source lines parallel to the bit lines for connecting source active regions of cells to one another, a source active region shared by two symmetrical cells connected to an identical bit line through different bit line contacts, and a source select transistor formed in an overlap area between a source line and a word line, for dividing the source active region. For programming a cell, that is, injecting electrons onto the floating gate of the cell, a cell current is generated by applying a positive voltage to a bit line and a word line of the selected cell, applying a reference voltage lower than the bit line voltage to a source line, and applying a voltage lower than the reference voltage to a word line of another unselected cell sharing the source active region with the selected cell.

Preferably, the reference voltage is about 0 V and the ground voltage and the voltage lower than the reference voltage is a negative voltage.

Preferably, a voltage higher than the threshold voltage of the source select transistor is applied to the word line of the selected cell during the programming operation.

Preferably, the source line is precharged during the programming operation.

Preferably, a post programming operation is subsequently performed for injecting fewer electrons onto the floating gate of the cell than those for the programming operation, and for applying a negative voltage lower than a voltage on the word line of another unselected cell to the word line of the unselected cell sharing the source active region with the selected cell.

Preferably, the initial threshold voltage of the source select transistor is lower than that of the cell.

During a cell reading operation, a positive voltage is applied to a bit line and a word line of a selected cell, a reference voltage lower than the bit line voltage is applied to a source line, and a voltage lower than a reference voltage is applied to a word line of another cell sharing the source active region with the selected cell.

In another aspect, the present invention comprises a non-volatile memory device. A plurality of bit lines are arranged in parallel in predetermined intervals, and a plurality of word lines are arranged perpendicularly to the bit lines and in predetermined intervals. A unit cell has a stacked gate structure comprising a floating gate and a control gate and is formed in an area where a bit line perpendicularly intersects a word line. A plurality of source lines are provided in parallel to the bit lines, for connecting source active regions of cells. A source active region is shared by two symmetrical cells connected to an identical bit line through different bit line contacts, and a source select transistor is formed in an overlap area between a source line and word line, for dividing the source active region. The source select transistor has a single-layer gate structure, and a gate insulating layer under the single-layer gate is at least as thick as a gate insulating layer under the floating gate of the cell.

Preferably, the active width of the source select transistor is equal to or larger than that of the cell.

Preferably, at least one of the source/drain junctions aligned to the single-layer gate of the source select transistor is different in structure from that of the source/drain junctions aligned to the stacked gate of the cell. For example, the source/drain junctions of the cell may comprise one of a single diffusion (SD) junction and a double diffusion (DD) junction or different in structure from each other, and the source/drain junctions of the source select transistor are one of a single diffusion (SD) junction and a lightly doped drain (LDD) junction or different in structure from each other. In addition, at least one of the source/drain junctions in the source select transistor may have the same structure as that of the source/drain junctions in a peripheral circuit transistor for driving the cell.

It is preferable that the source active region is divided into units of less than a plurality of cells in a word line direction and more than the input/output (I/O) terminals, while connecting the plurality of cells.

In another aspect, the present invention is directed to a method of fabricating a non-volatile memory device having a cell array including a plurality of cells having a stacked gate structure comprising a floating gate and a control gate, a source select transistor of a single-layer gate structure for connecting source active regions of the cells to a source line, and a peripheral circuit region for driving the cells. An active region and a field region are defined on a semiconductor substrate. A first gate insulating layer and a first conductive layer for a cell are sequentially formed on the semiconductor substrate. Floating gates of cells are isolated from each other by partially exposing the field region between active regions and etching the first conductive layer. An interpoly dielectric layer is formed on the resultant structure. Active regions are defined in the peripheral circuit region and a source select transistor of the cell array. The exposed interpoly dielectric later, first conductive layer and first gate insulating layer are etched, and then second and third gate insulating layers are formed in the peripheral circuit region and the source select transistor. A second conductive layer is formed on the resultant structure, gate regions of the cell and the peripheral circuit region are defined, and the second conductive layer is etched. The source active regions in the peripheral circuit region and the cell array are masked, and the exposed interpoly dielectric layer and first conductive layer are etched, to form a stacked gate comprising a floating gate as the first conductive layer and a control gate as the second conductive layer.

During the step of dividing the semiconductor substrate into an active region and a field region, the active width of the source select transistor is preferably equal to or larger than that of the cell.

The second and third gate insulating layers are preferably formed by twice performing oxidation, such that they are thicker than the first gate insulating layer. The second gate insulating layer of the peripheral circuit region has a plurality of thicknesses, and the third gate insulating layer of the source select transistor is formed to have one of the thicknesses of the second gate insulating layer of the peripheral circuit region.

In the step of forming a second conductive layer, defining gate regions for the cell and the peripheral circuit region, and etching the second conductive layer, the second conductive layer and a capping insulating layer are sequentially formed on the resultant structure having the second and third gate insulating layers in the peripheral circuit region and the source select transistor, the gate regions of the cell and the peripheral circuit regions are defined by a photoresist pattern, the exposed capping insulating layer is etched, the photoresist pattern is removed, and then the exposed second conductive layer is etched, using the capping insulating layer as an etching mask.

In the step of forming a second conductive layer, defining gate regions for the cell and the peripheral circuit region, and etching the second conductive layer, the second conductive layer and a capping insulating layer are sequentially formed on the resultant structure having the second and third gate insulating layers in the peripheral circuit region and the source select transistor, the gate regions of the cell and the peripheral circuit regions are defined by a photoresist pattern, the exposed capping insulating layer and second conductive layer are sequentially etched, and then the photoresist pattern is removed.

Following the step of forming the stacked gate, impurity ions are implanted for forming source/drain regions of the cell, with the peripheral circuit region and the source active region being masked.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS

Figure 8:
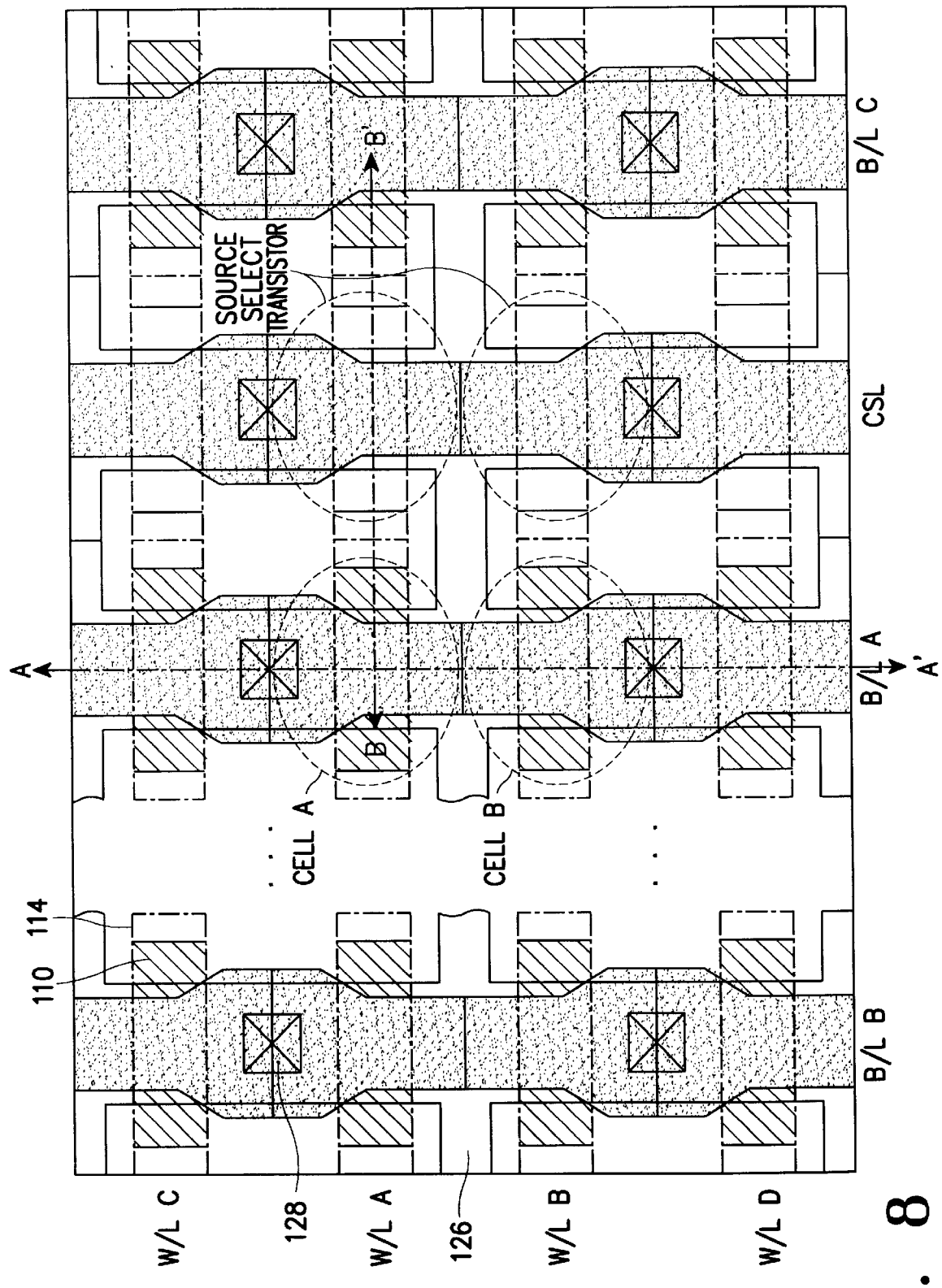
FIG. 8 is a layout diagram of a NOR flash memory cell array according to the present invention.
Figure 9:
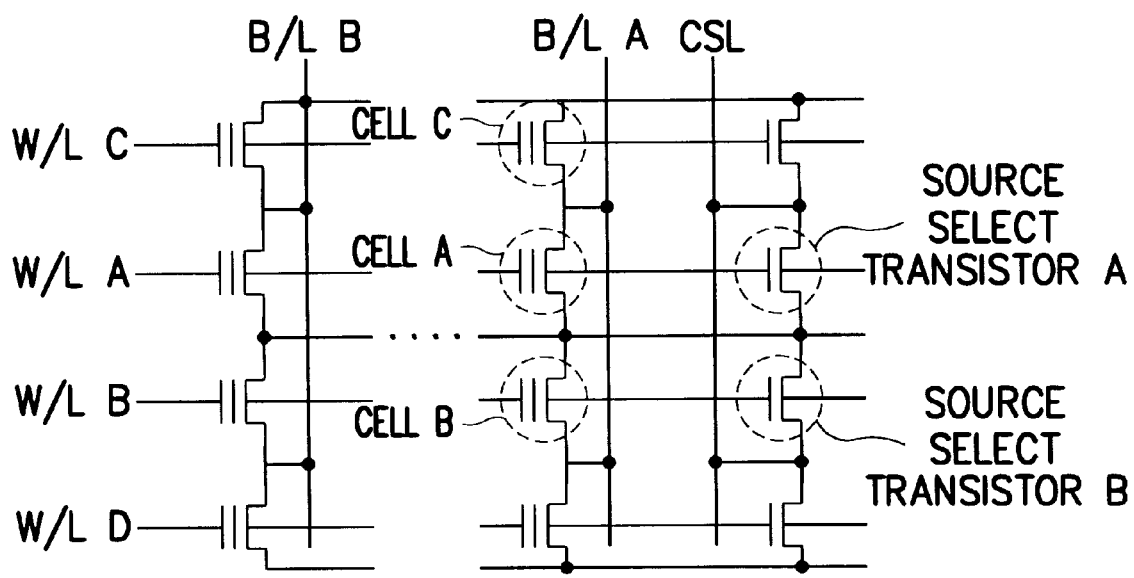
FIG. 9 is an equivalent circuit diagram of the cell array shown in FIG. 8.

FIG. 8 is a layout diagram of a NOR flash memory cell array according to the present invention, and FIG. 9 is an equivalent circuit diagram of the cell array shown in FIG. 8.

Figure 1:
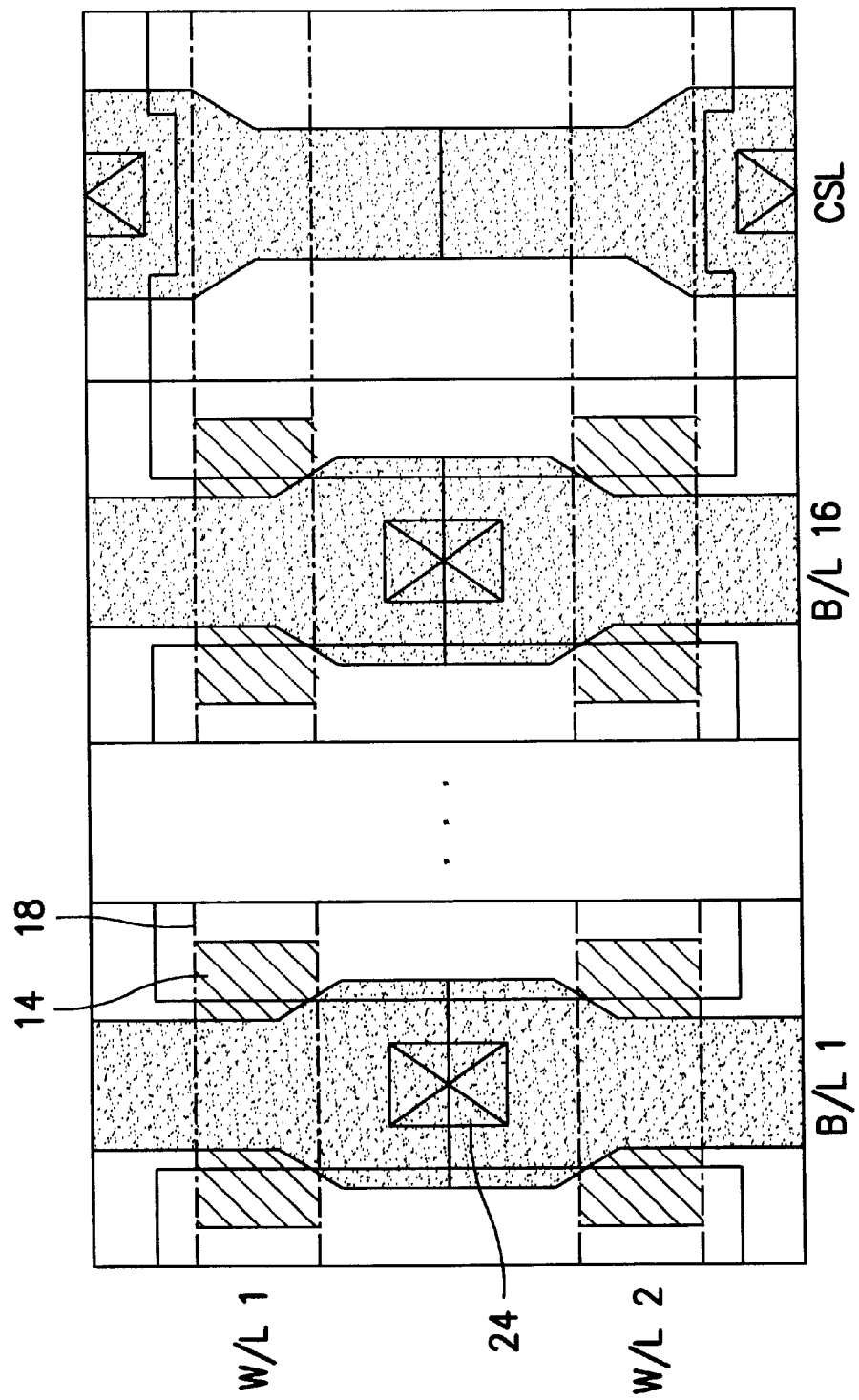
FIG. 1 is a layout diagram of a conventional NOR flash memory cell array.
Figure 2:
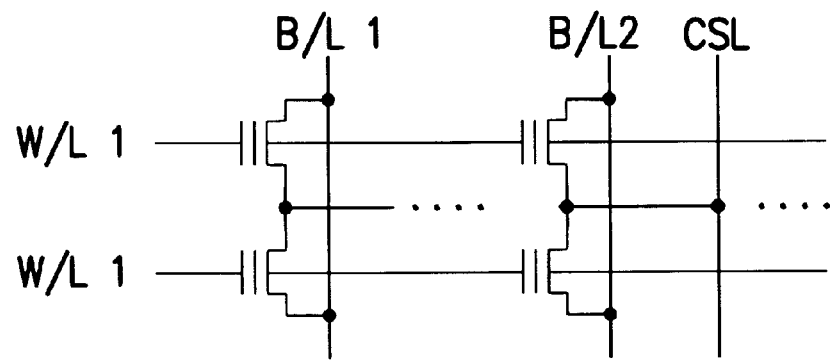
FIG. 2 is an equivalent circuit diagram of the cell array shown in FIG. 1.
Figure 3:
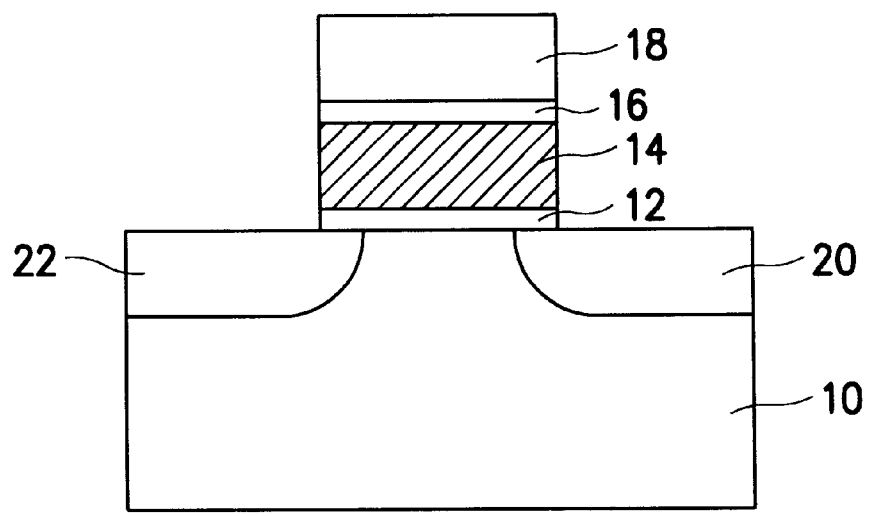
FIG. 3 is a vertical sectional view of a unit cell in the cell array shown in FIG. 1.
Figure 4:
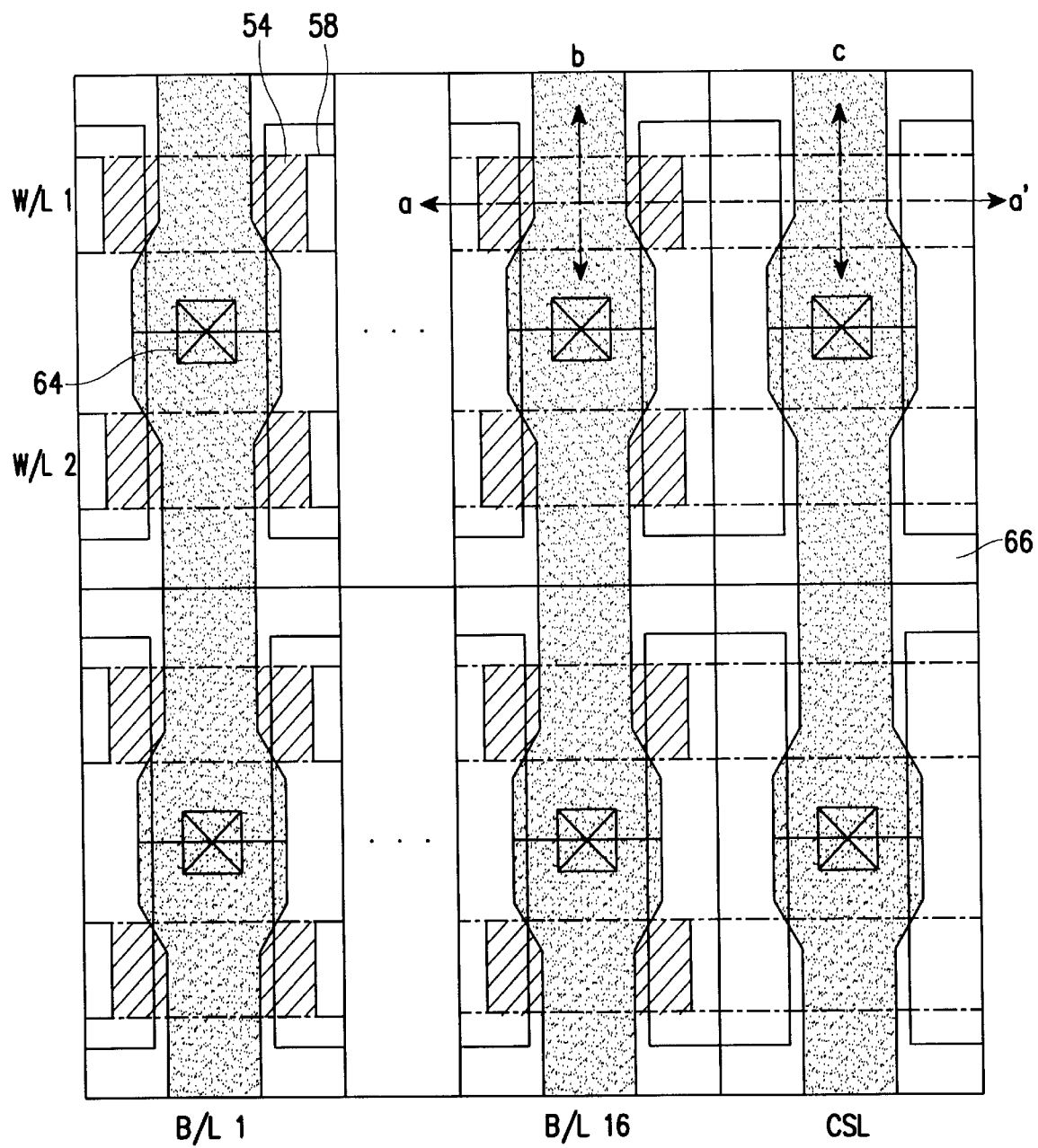
FIG. 4 is a layout diagram of another conventional NOR flash memory cell array.
Figure 5:
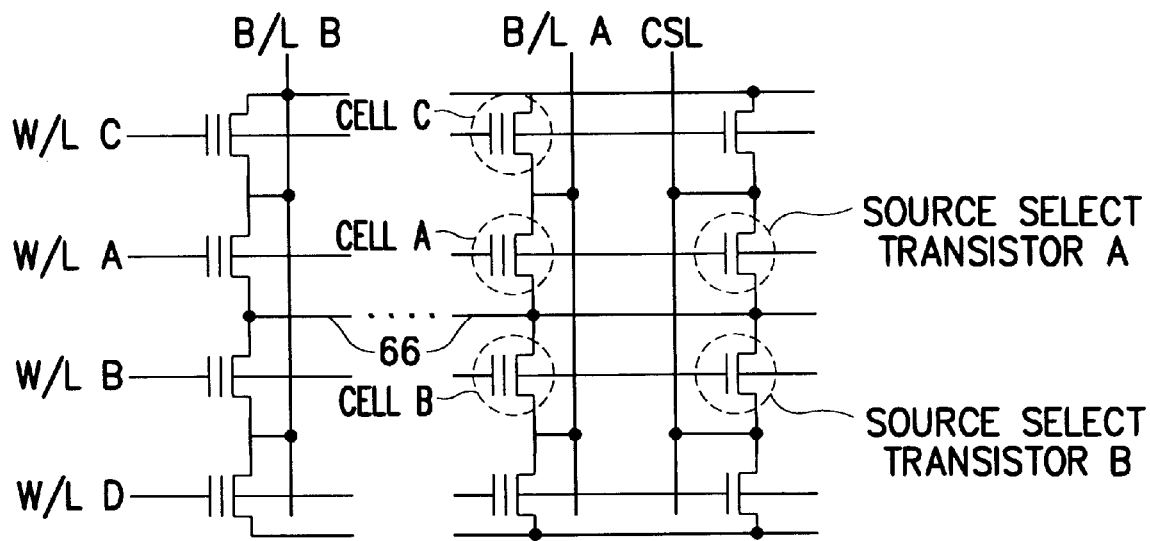
FIG. 5 is an equivalent circuit diagram of the cell array shown in FIG. 4.
Figure 6:
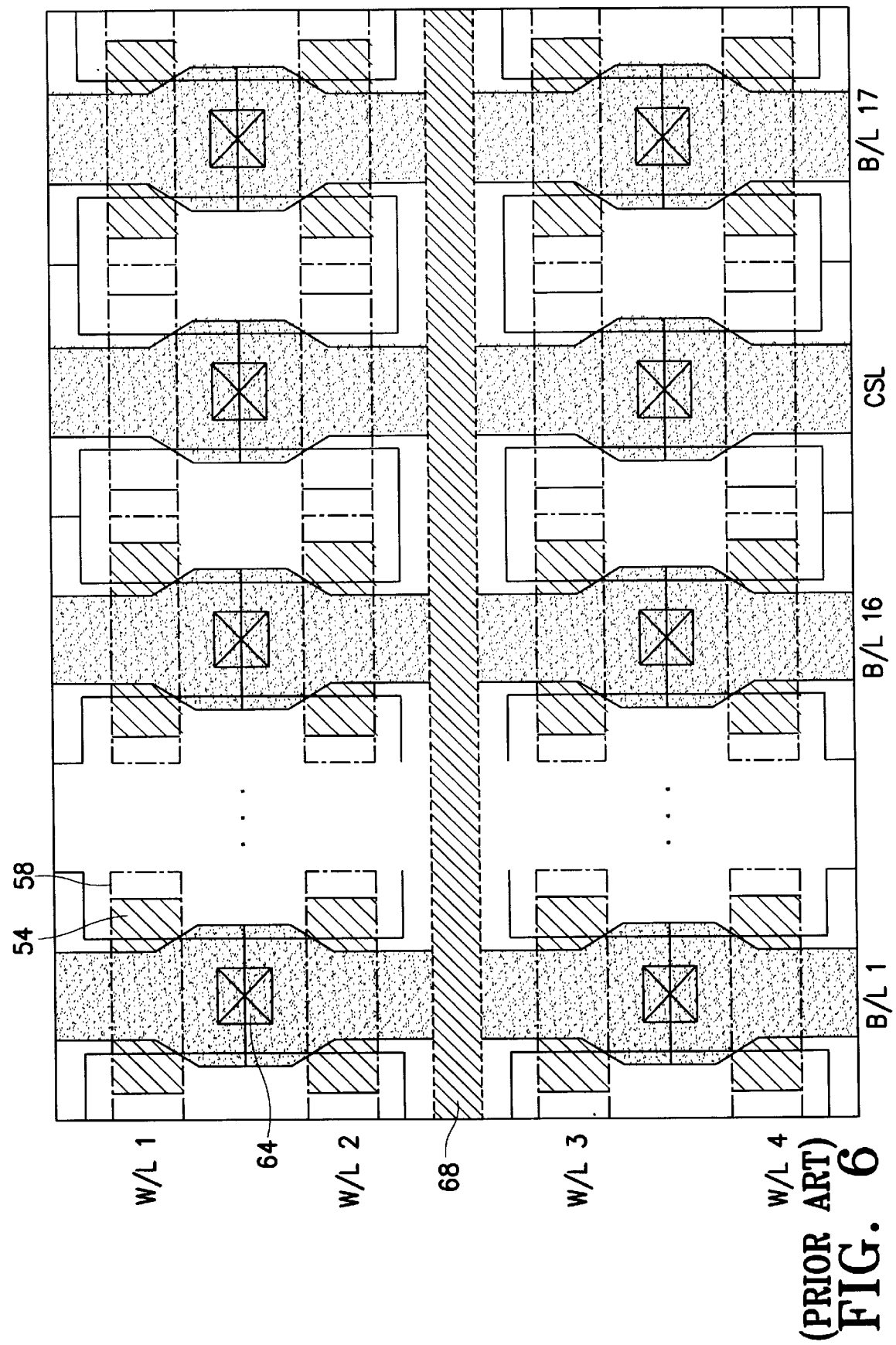
FIG. 6 is a layout diagram of a third conventional NOR flash memory cell array.

As shown in FIGS. 8 and 9, a source select transistor is formed between a source line and a source active region as in the conventional NOR flash memory cell array (see FIGS. 4 and 5).

Referring to the figures, a unit cell having a stacked gate structure of a floating gate 110 and a control gate 114 is formed in an area where a word line W/L perpendicularly intersects a bit line B/L, the bit line being a metal layer. A plurality of cell arrays are formed, each including a plurality of bit lines B/Ls, word lines W/Ls, and source lines CSLs, arranged in predetermined intervals. Two adjacent cells are connected to a bit line B/L through a single bit line contact 128, and source active regions 126 of respective cells, comprising impurity layers parallel to a word line W/L, are connected by a source line CSL provided every few bits and disposed in parallel with a bit line B/L.

The source active region 126 is divided by a source select transistor formed in an overlap region between a source line CSL and a word line W/L. Two symmetrical cells connected to the same bit line B/L through different bit line contacts 128, for example, cell A and cell B, share a single source active region 126.

Erasing, programming, and reading operations of the above NOR cell according to the present invention will be described in detail, referring to FIGS. 8 and 9.

The NOR cell of the present invention is erased according to a technique referred to as a negative bulk erase technique, as opposed to the conventional high-voltage drain erase method. After a word line W/L is subjected to −10 V and a bit line B/L and a source line CSL are floated, a voltage 5–7 V is applied to a bulk substrate, so that electrons stored on a floating gate are removed to the bulk region by Fowler-Nordheim tunneling with a voltage across both ends of a tunnel oxide film, and thus the threshold voltage Vth of the cell is changed to its initial level, 2 V. In the conventional high-voltage drain erase technique of applying 0 V to a word line and an erase voltage to a bit line, the drain should be formed as a DD junction structure in order to prevent a drain junction from being destroyed at 10 V or higher and in order to suppress leakage current. By contrast, the negative bulk erase technique of the present invention allows for the use of a general single drain junction because a high voltage is not applied to a source or drain junction, thereby reducing the diffusion length of the junction and increasing the effective channel length of the cell. Therefore, the bulk erase technique of the present invention can improve the operational characteristics of the cell and reduce cell area, contributing to high integration. However, in the present invention, the threshold voltages of all cells may not necessarily be changed to the intended level of 2 V, and therefore there may exist some cells overerased to approximately 0 V. The present inventive technique addresses this issue.

For a programming operation of, for example, cell A, the threshold voltage of the cell A is increased to 7 V or higher by causing a current to flow through the selected cell A through application of 10 V to a selected word line W/L A, application of 5–6 V to the bit line, and 0 V to the source line CSL and the bulk substrate, and thereby injecting a portion of the hot electrons generated by a horizontal field at a drain region onto a floating gate by a vertical field to a gate. Here, if cell B, sharing the source active region with cell A, is overerased in the conventional cell array of FIG. 4, a portion of the current capacity required for programming of cell A is consumed through cell B, resulting in insufficient programming of cell A or programming of the unselected cell B. This is because 0 V is applied to all unselected word lines. Meanwhile, in the present invention, 0 V is applied to unselected word lines, while applying a negative voltage to a word line sharing a source active region with a selected cell among the unselected word lines.

In general, the negative voltage is generated as an operational voltage Vcc by a negative charge pumping scheme. Charge pumping refers to generating a required voltage by storing charge in a capacitor generated with an applied voltage. Hence, with charge pumping, the larger the current capacitive requirement of the generated voltage, the larger the area of the necessary capacitor. Accordingly, the increase in the capacitor area becomes an obstacle to applying to a high-integration memory device the method of preventing a current path through an unselected cell by applying a negative voltage lower than the threshold voltage of the overerased cell to all unselected word lines. Moreover, even if the capacitor area can be minimized, another problem lies in the long charge time (i.e., CV=it) required to charge the capacitors of all word lines to an intended voltage. Therefore, it is very difficult to apply the negative voltage to word lines during the programming period.

Under these conditions, the present invention solves the aforementioned charge pumping limitations by removing an unintended current path through unselected cells not sharing a source active region with a selected cell. A word line voltage of 0 V is applied to the selected cell, using a source select transistor having a positive threshold voltage +Vth, and a voltage in the −1 V to −5 V range is applied to only the word line of an unselected cell sharing the source active region with the selected cell by charge pumping, during programming of the cell. Thus, in case the unselected cell B sharing the source active region 126 with the selected cell A is overerased, the source select transistor B is not activated, due to a negative voltage applied to word line W/L B, thereby preventing formation of a current path from the unselected cell B to the source line CSL. In addition, when an unselected cell C not sharing the source active region 126 with the selected cell A is overerased, 0 V across an unselected word line W/L C removes the current path.

During a reading operation, data is read, that is, the programmed and erased states of the selected cell A are determined by judging the absence and presence of a current path through the cell A according to the threshold voltage of the cell. A voltage of 1 V is applied to a selected bit line, 5 V is applied to a selected word line W/L A, and −2 V is applied to an unselected word line W/L B sharing the source active region 126 with the selected cell A. In this case, since a negative voltage is applied to the word line W/L B of the unselected cell B, an overerasure-induced data misreading of the selected cell A can be prevented.

In the absence of an overerased cell during the reading operation, the negative voltage may not be applied to the single unselected word line, and thus an overerased cell may be found after erasing and programmed to an initial threshold voltage, that is, a post programming operation can be added. This post programming is a general technique to solve the overerasure problem in a cell array having no select gates. That is, the post programming indicates that an overerased bit is detected after reading all cells following an erasing operation, and a soft programming is performed on the bit to allow its threshold voltage to 1–2 V by applying a voltage lower than a programming voltage to the bit. The soft programming is implemented to a predetermined level with a low program current generated through the cell by applying 5–6 V to the selected bit line and 2–5 V to the selected word line. However, in the presence of an overerased cell among cells connected to the unselected word lines of a selected word line, the post programming cannot be performed to an intended level or an operational speed can be reduced because of formation of a current path through the overerased cell. This overerasure problem is addressed in the present invention by applying a negative voltage to the word line of an unselected cell sharing a source active region with the selected cell, during post programming.

To implement such an operation in the NOR flash memory cell array using source select transistors according to the present invention, the threshold voltages of the source select transistors should be 0 V or higher. During reading, programming, and post programming, the threshold voltage of the source select transistor should be lower than the voltage on the selected word line in order not to limit cell current.

In the NOR flash memory cell array of the present invention, the cell current can be increased by forming the active width of a source select transistor to be larger than that of the cell or by reducing the channel length of the cell in a given active width. For this purpose, the word line width, that is, the gate length of the cell, may be reduced, which is likely to produce punchthrough of the source select transistor. Preferably, the active width of the source select transistor is made to be larger than that of the cell and the word line width is likewise increased. It is also preferred to improve punchthrough by forming a thin source/drain junction for the select transistor, such as a lightly doped drain (LDD) structure.

Figure 10:
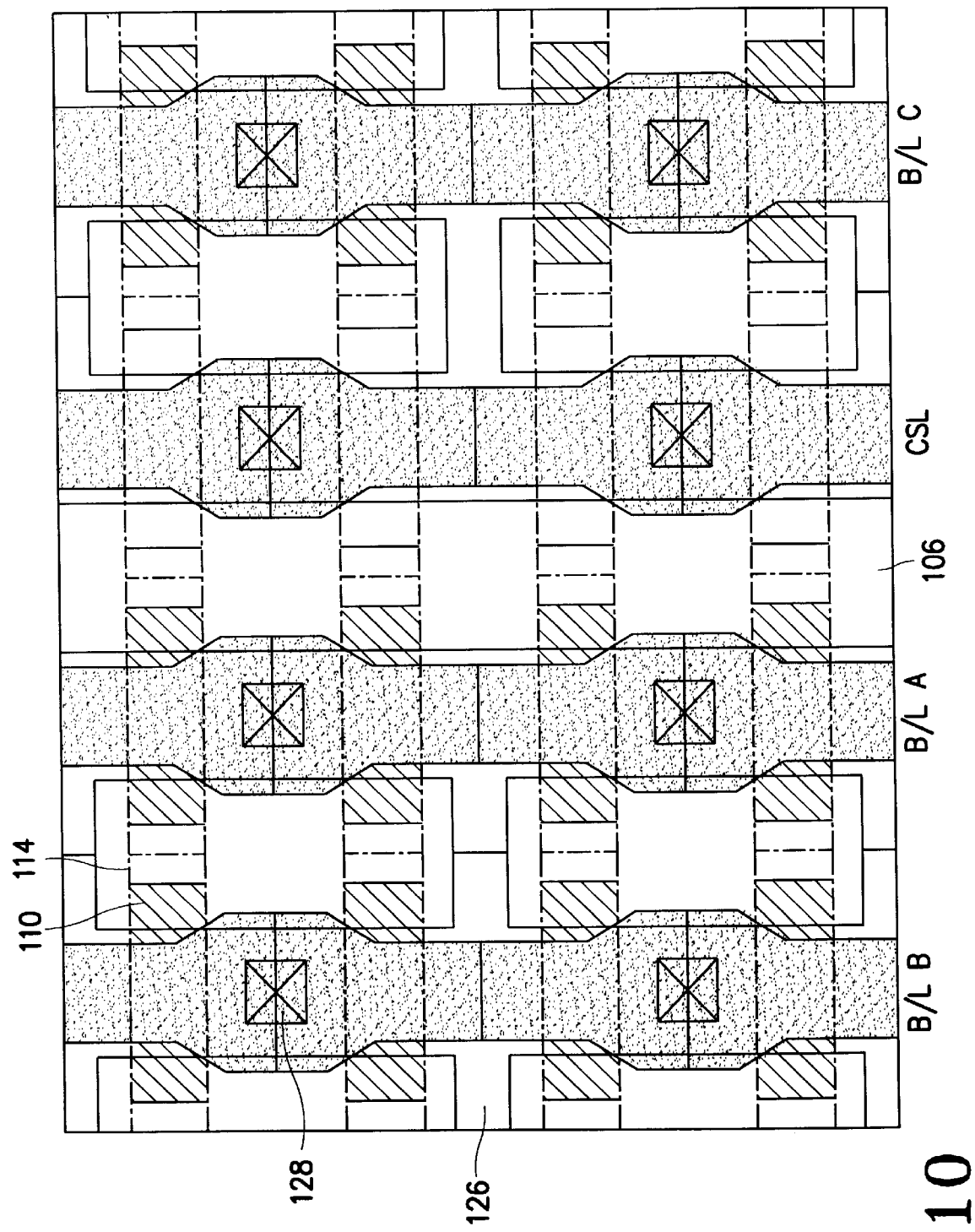
FIG. 10 is a layout diagram of a source active region and a source line in the NOR flash memory cell array according to the present invention.

FIG. 10 is a layout diagram of a source active region and a source line in the NOR flash memory cell array of the present invention.

A conventional NOR flash memory cell array has a source active region which is divided into either an input/output (I/O) unit or a cell unit. In the former, charging possibly generated for a short reading period is of concern, whereas the latter case is disadvantageous in that the requirement of a source active region for each cell increases cell area. To circumvent these problems in the present invention, the source active region 126 is divided by a field region 106 in every few intervals of cells, as shown in FIG. 10. Separation of the source active region 126 without increasing the area of a cell array results in a reduction of time required to charge an unselected source active region during reading, programming, and post programming. That is, when an unselected cell sharing a source active region 126 with a selected cell is overerased during programming a slight amount of, current flows through the unselected cell with a word line voltage of 0 V until the source active region 126 is charged and, though the current does not reach the source line CSL due to the source select transistor, a short charge time is consumed. Since the current and time are defined by the equation CV=it, as the capacitance of the source active region 126 increases and the threshold voltage of the overerased cell decreases, the corresponding current and time increase. To reduce the current and time, it is preferable to divide the source active region 126 into units of more than the minimum number of bit lines, as many as or less than the number of source lines, and less than the conventional I/O units.

If the layout of FIG. 10 is not employed, a source charge time can be freely determined prior to reading, programming, and post programming. That is, after the source active region of a cell is precharged to a predetermined voltage level by biasing a bulk substrate, a source line, and a bit line, alone or in plural forms, and a word line, the reading, programming, and post programming operations can be performed.

A method of fabricating a NOR flash memory device for realizing the above operations according to the present invention will now be described in detail, referring to the attached drawings.

FIGS. 11A through 16 are sectional views and layout diagrams of the fabricating method of the cell array shown in FIG. 8. Here, FIGS. 11A, 12A, 13, 14A, 15A, and 16 are sectional views, and FIGS. 11B, 12B, 14B, and 15B are layout diagrams.

Figure 11A:
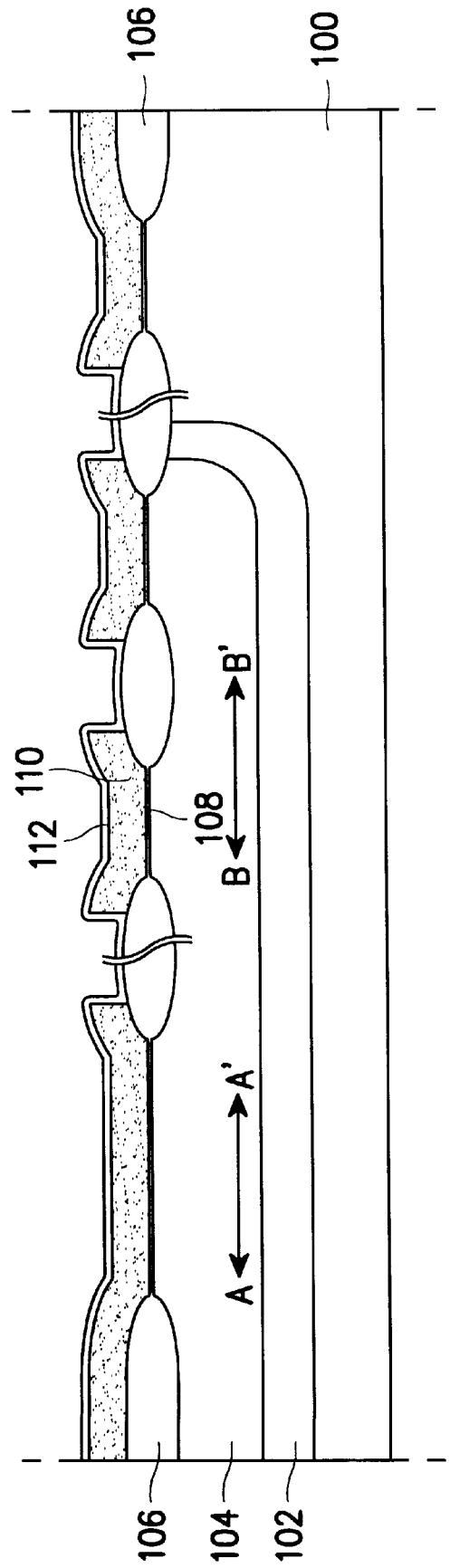
FIGS. 11A through 16 are various sectional views and layout diagrams for describing a method of fabricating the cell array shown in FIG. 8.
Figure 11B:
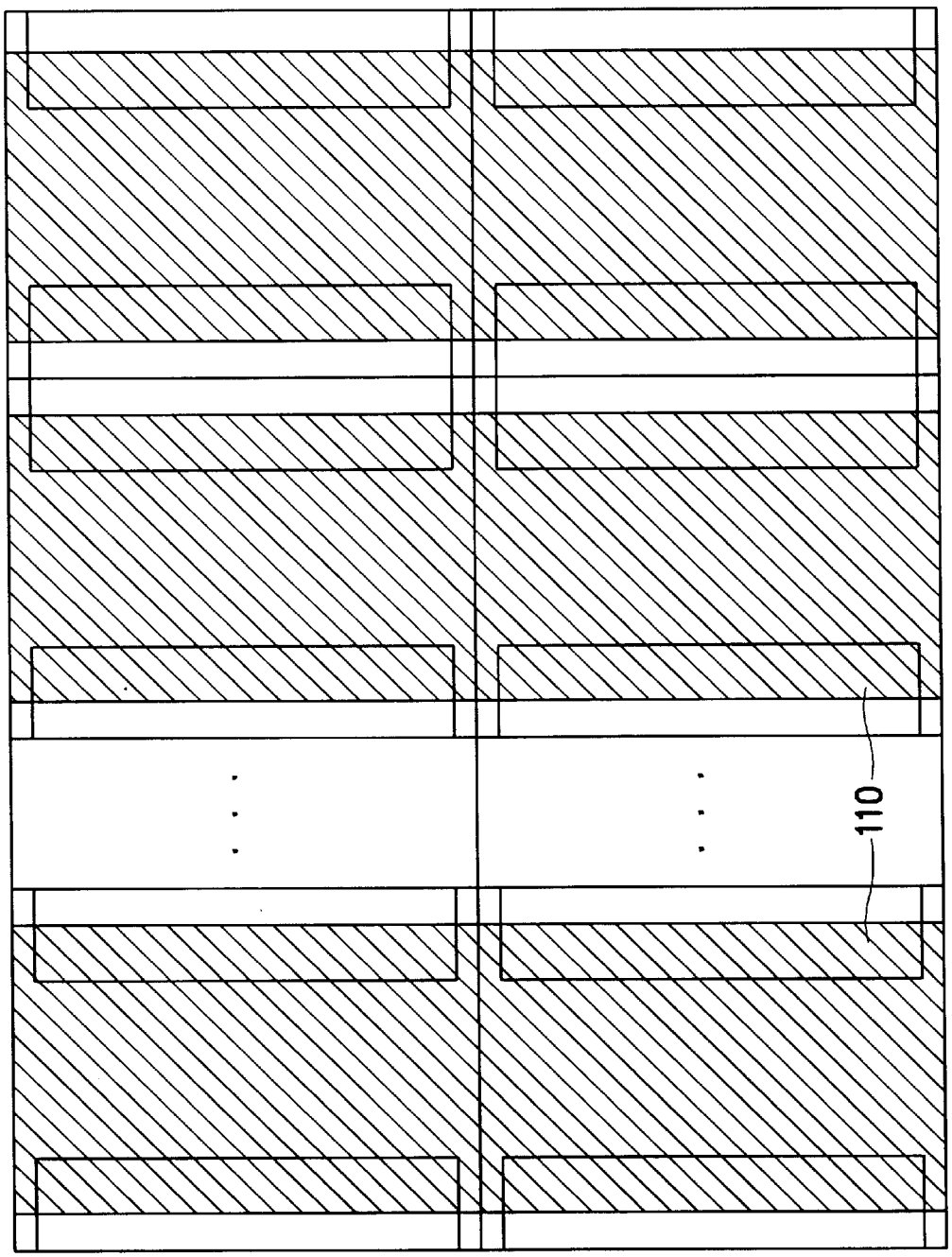

FIGS. 11A and 11B show the step of forming the floating gate 110. An n-well 102 is formed by implanting an n-impurity into the surface of a p-semiconductor substrate 100 by photolithography and ion-implantation, and by diffusing the n-impurity to an intended depth by high-temperature thermal treatment. A p-well 104 is then formed by implanting a p-impurity into the surface of the substrate 100 except for the n-well 102, and into a cell array region of the n-well 102 by photolithography and ion implantation and diffusing the p-impurity by high-temperature thermal treatment. Generally, a well for forming an NMOS transistor therein in a peripheral circuit region is referred to as a p-well, while a well to be formed in the cell array region of the n-well 102 is referred to as a pocket p-well 104.

Subsequently, a field oxide film 106 is formed to a thickness in the 5000–6000 Å range on the substrate 100 by a general device isolation technique, for example, LOCOS (LOCal Oxidation of Silicon) or PBL (Polysilicon Buffered LOCOS), to define an active region and a field region on the substrate 100. A sacrificial oxide film is then formed to remove unnecessary films at the interface between the active and field regions, and removed by wet etching.

Preferably, the active widths of a cell and a source select transistor are different. That is, cell current is increased by forming the active width of the source select transistor to be equal to or larger than that of the cell.

A first gate oxide film 108 for a unit cell is formed by growing a thin oxide film or oxynitride film, usually called a tunnel oxide film, to a thickness of 100 Å on the active region. To control the threshold voltage of the cell, the step of defining a cell region by photolithography and implanting a p-impurity ion may be applied following formation of the field oxide film 106. The first gate oxide film 108 of the cell is formed to a thickness of approximately 200 Å in an EPROM which is not electrically erased.

Following this, a first conductive layer 110 for a floating gate is formed by depositing, for example, polysilicon on the resultant structure having the first gate oxide film 108 formed thereon, and doped to be of an $n^+$ type by depositing phosphorous (P)-rich $POCL_3$. Floating gates of adjacent cells along a bit line are isolated from each other by anisotropically etching the first conductive layer 110 on the field oxide film 106 in the cell region by photolithography. That is, the first conductive layer 110 for a floating gate is a pattern covering the active region and a portion of the field region in the cell, divided in a portion of the field oxide film 106, and extending in the direction of the bit lines. Here, the first conductive layer 110 is formed into the same pattern as in the cell in a plurality of source active regions and portions of field regions parallel to a bit line. In the peripheral circuit region, the first conductive layer 110 remains or is entirely removed by masking of a photoresist pattern (not shown).

Next, an ONO (Oxide/Nitride/Oxide) film is, for example, formed as an interpoly dielectric layer 112 on the resultant structure to isolate a floating gate from a control gate. That is, the ONO interpoly dielectric layer 112 is formed by growing an about 100 Å-thick first oxide film by oxidation of the first conductive layer 104, depositing a nitride film of about 130 Å-thickness, and growing an 40 Å-thick second oxide film by oxidation of the nitride film. The interpoly dielectric layer 112 is preferably about 130–180 Å thick in terms of an equivalent oxide film thickness.

Figure 12A:
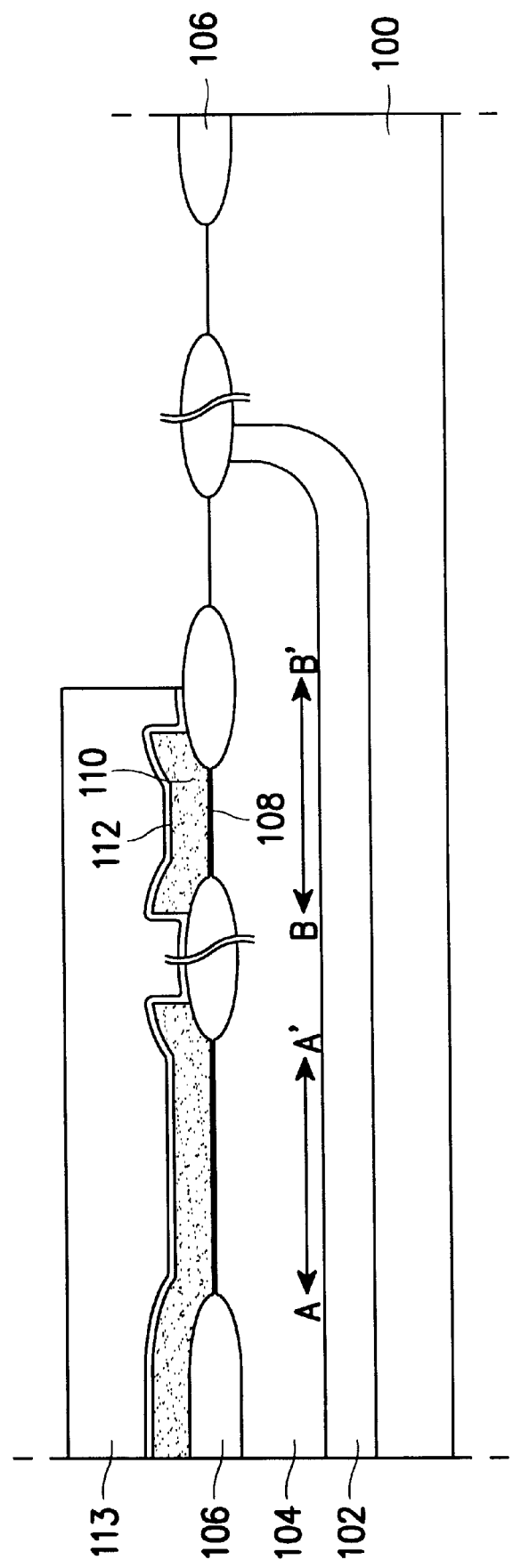
Figure 12B:
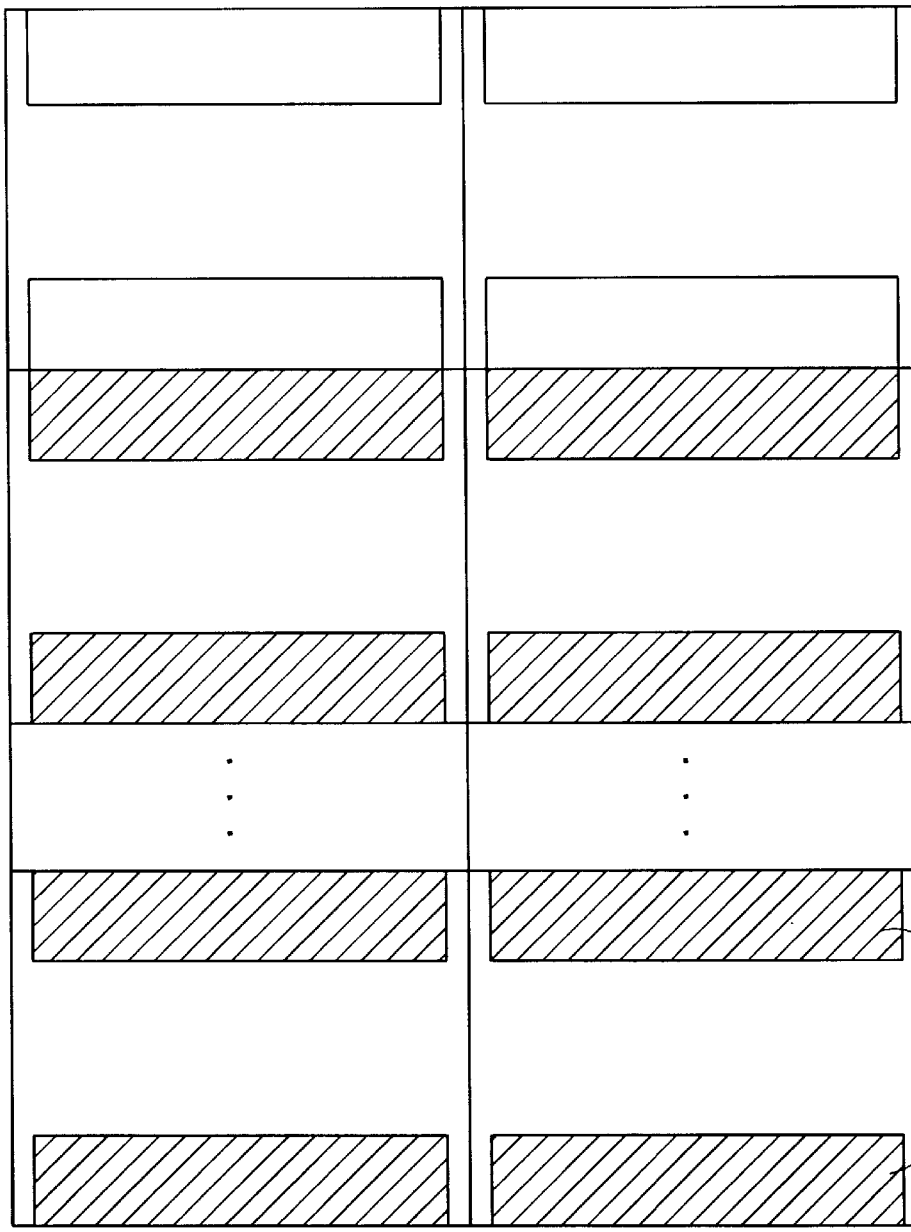

FIGS. 12A and 12B show the step of removing the interpoly dielectric layer 112 and the first conductive layer 110 in the peripheral circuit region. A photoresist pattern 113 is formed on the resultant structure having the interpoly dielectric layer 112 formed thereon to open the peripheral circuit region. Then, the interpoly dielectric layer 112 and the first conductive layer 110 are sequentially removed from the exposed peripheral circuit region by dry etching. The remaining insulating layer, namely, the first gate oxide film 108, is removed by wet etching lest the substrate 100 should be damaged. Here, when etching the first conductive layer 112 in the peripheral circuit region in the step of FIGS. 11A and 11B, the interpoly dielectric layer 112 is removed together with the underlying insulating layer, that is, the first gate oxide film 108 of the cell.

Though the cell array region is generally masked by a photoresist pattern during the etching, a source line region is defined and the interpoly dielectric layer 112, the first conductive layer 110, and the first gate oxide film 108 which cover the source line region are removed, in the present invention.

Here, when etching of the interpoly dielectric layer 112 and the first conductive layer 110 is completed, the step of implanting a p-impurity ion may be additionally implemented to control the threshold voltage of a peripheral circuit transistor or a source select transistor in the cell region.

Figure 13:
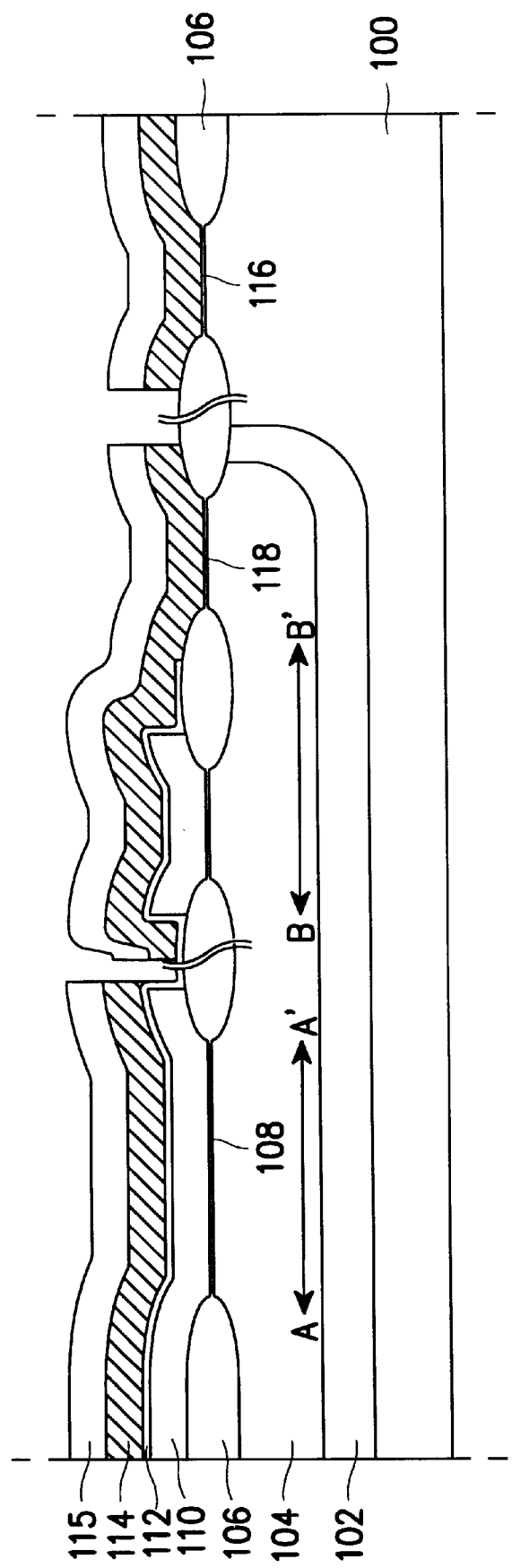

FIG. 13 shows the step of forming second and third gate oxide films 116 and 119, and a second conductive layer 114. After the interpoly dielectric layer 112, the first conductive layer 110, and the first gate oxide film 108 are selectively removed from the peripheral circuit region and the source line region, an oxide film is grown in an exposed active region, that is, a peripheral circuit active region and a source active region. As a result, the second gate oxide film 116 is formed in the active region for forming a peripheral circuit transistor thereon, and the third gate oxide film 118 is formed in the active region for forming a source select transistor of the cell thereon.

The thickness of the second gate oxide film 116 depends on the driving capability of an adjacent peripheral circuit transistor. That is, the second gate oxide film 116 is formed to be about 100–160 Å thick with an operational voltage at or below 5 V, and about 200–400 Å thick with an operational voltage at or above 10 V. When the voltages are all used as necessary, the second gate oxide film 116 may have a plurality of thicknesses by performing an oxidation at least twice. That is, to form a thick gate oxide film, a thick first oxide film is formed on the exposed active region, and then removed by exposing the peripheral circuit active region requiring a thin gate oxide film by photolithography. Then, a second oxide film thinner than the first oxide film is grown, thereby completing a thick gate oxide film region having the first and second oxide films and a thin gate oxide film region having the second oxide film. Here, it is preferred to form the third gate oxide film 118 of the source select transistor to be as thick as or thicker than the first gate oxide film 108 provided as the tunnel oxide film of the cell, so that injection and removal of electrons by Fowler-Nordheim tunneling, observed in the cell, does not take place in the source line region during programming or erasing of the cell.

Subsequently, a polycide layer is formed as a second conductive layer 114 for a control gate on the resultant structure by sequentially depositing, for example, $n^+$ doped polysilicon and a metal silicide such as tungsten silicide (WSix), titanium silicide (TiSix), and tantalum silicide (TaSix). A capping layer 115 is formed by depositing an insulating layer being an oxide film, a nitride film, or their combination on the second conductive layer 114 to a thickness of about 2000–4000 Å.

Figure 14A:
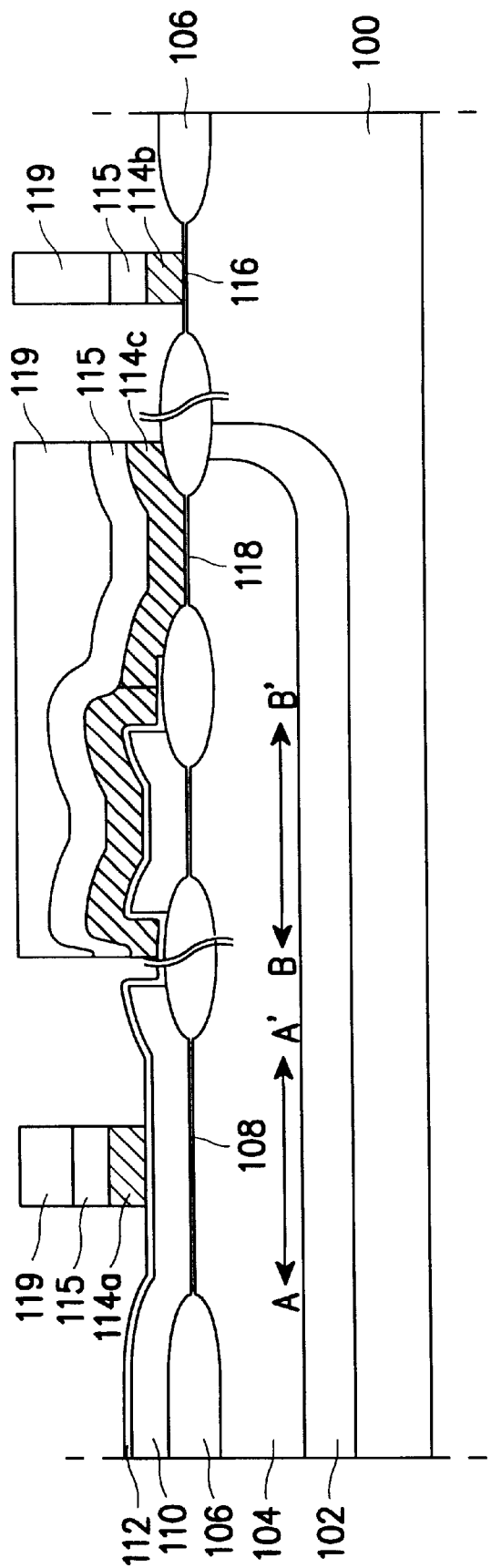
Figure 14B:
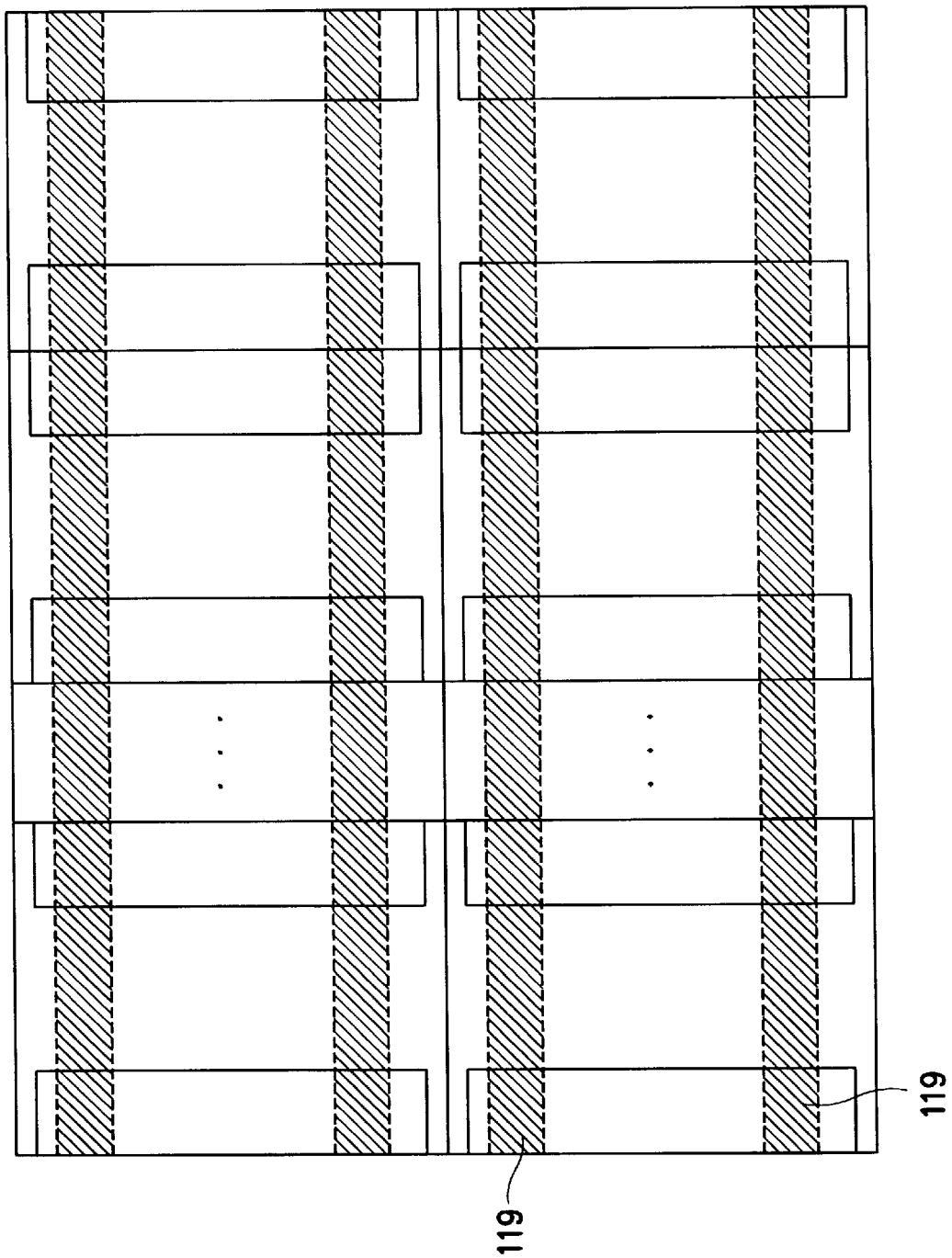

FIGS. 14A and 14B show the step of forming a control gate 114a for the cell and a gate 114b in the peripheral circuit region. After the capping layer 115 is formed, a photoresist pattern 119 is formed by photolithography to form a word line pattern for the cell array and a gate pattern for the peripheral circuit region. Then, the exposed capping layer 115 and the second conductive layer 114 are etched, using the photoresist pattern 119 as an etching mask. To prevent non-uniform supply of an etchant gas to a pattern-dense region caused by the high height of the photoresist pattern 119, the photoresist pattern 119 may be removed after etching of the exposed capping layer 115 and the second conductive layer 114 may be etched, using a capping layer 115 which is thinner than the photoresist pattern 119 as an etching mask. From the above step, the control gate 114a is formed in the cell array region, and the single-layer gate 114b of the second conductive layer is formed in the peripheral circuit region. A single-layer source select gate 114c of the second conductive layer is formed in the source active region.

Figure 15A:
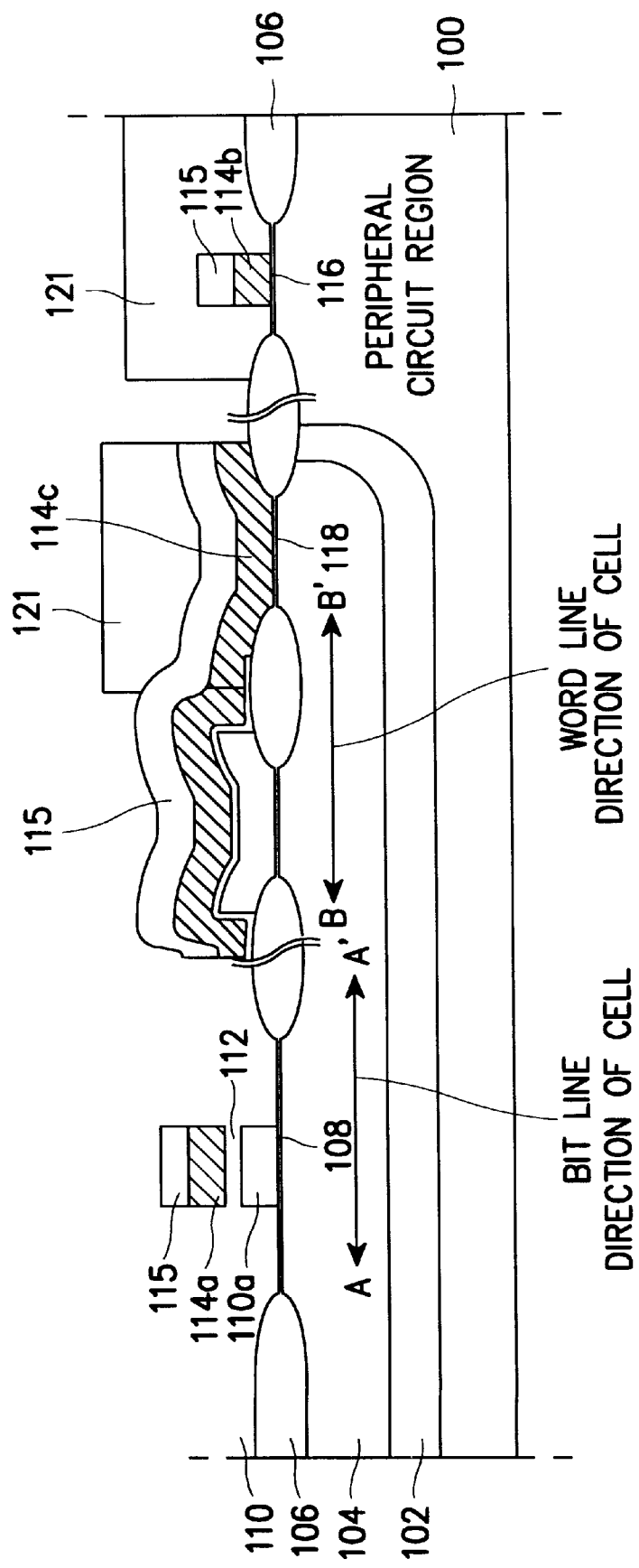
Figure 15B:
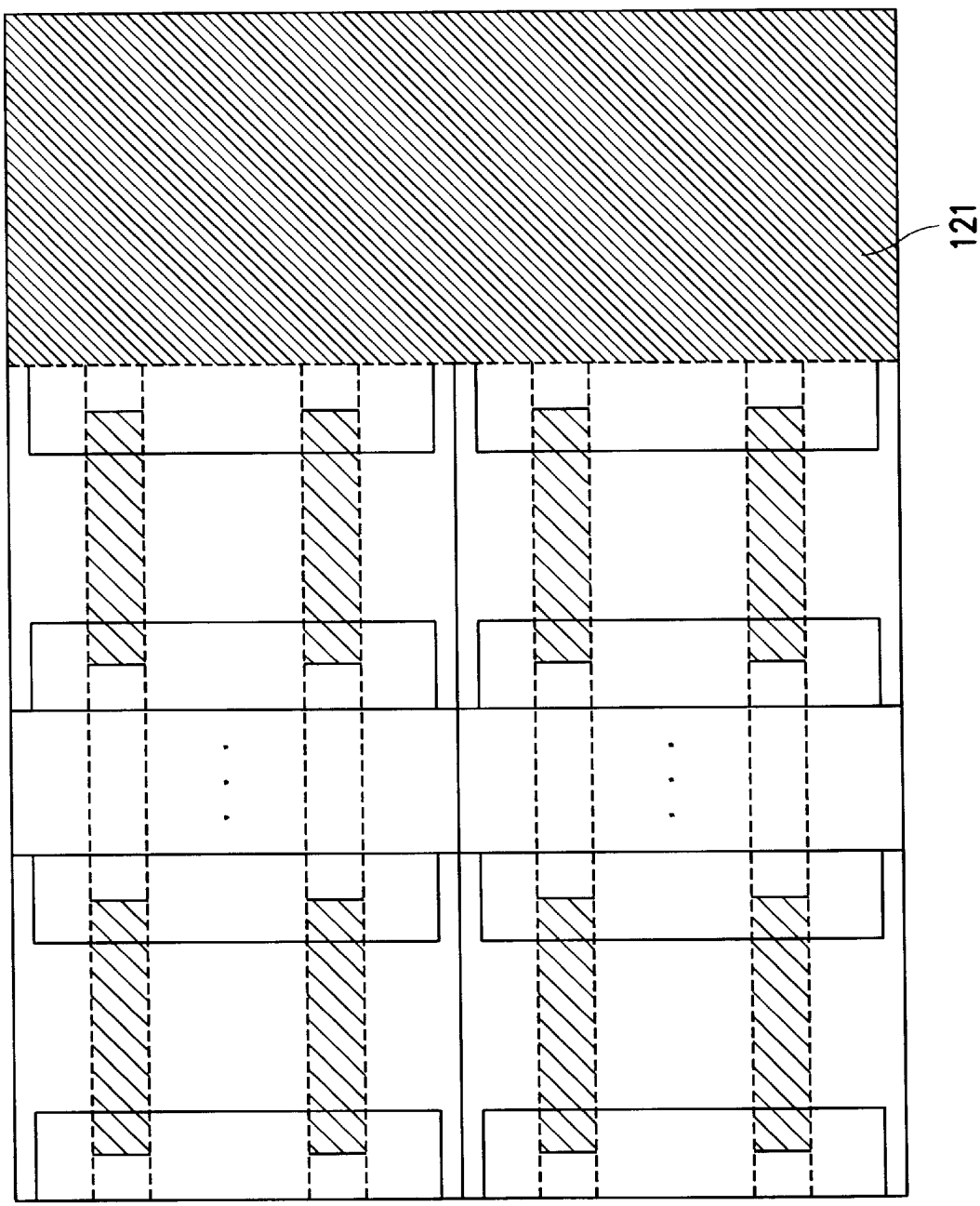

FIGS. 15A and 15B show the step of forming a stacked gate for the cell. Following formation of the gate 114b in the peripheral circuit region, source active regions in the peripheral circuit region and the cell array are masked with a photoresist pattern 121 by photolithography. Then, the stacked gate is formed to have a floating gate 110a and the control gate 114a in the cell by sequentially removing the interpoly dielectric layer 112 and the first conductive layer 110, using the exposed capping layer 115 in the cell array as an etching mask.

Figure 7A:
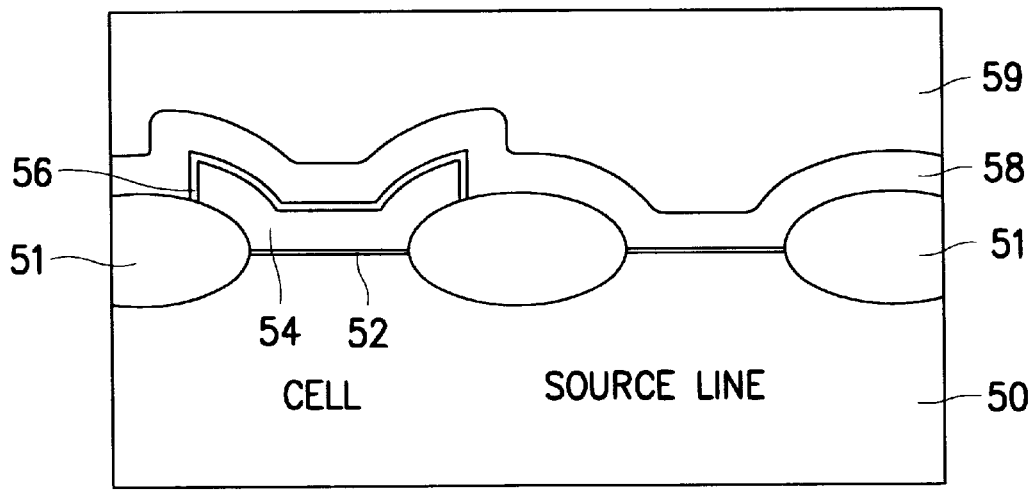
FIGS. 7A, 7B, and 7C are vertical sectional views of FIG. 4, taken along lines a—a', b—b', and c—c', respectively.
Figure 7B:
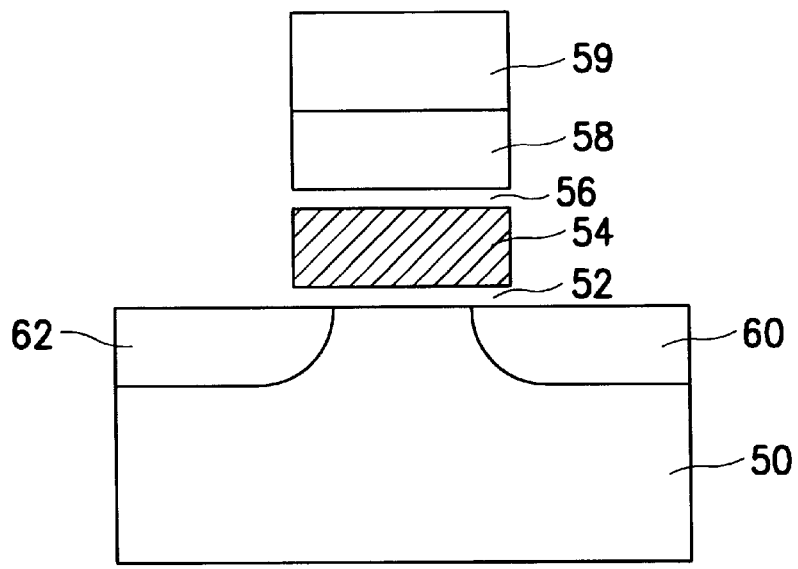
Figure 7C:
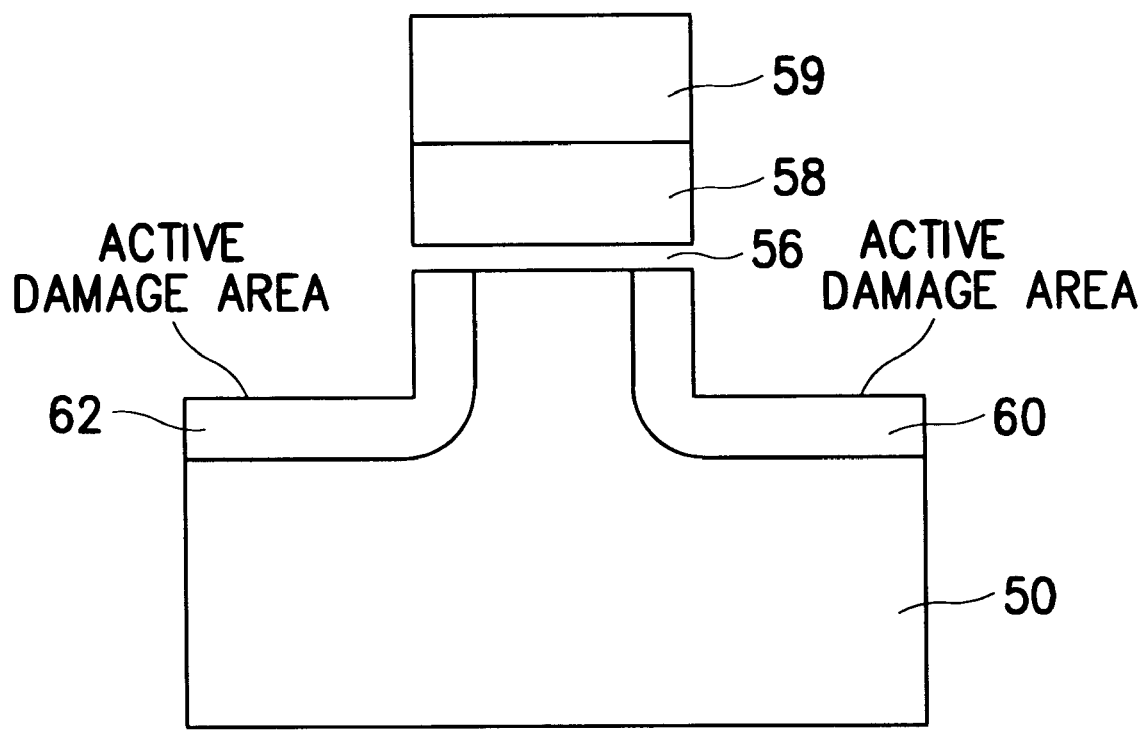

The active region is not exposed during the etching for forming the source select transistor having a MOS single-layer gate structure in the cell array of the stacked gate structure according to the present invention. Therefore, the active region of the source select transistor is not damaged by the etching process of the present invention, as opposed to conventional techniques as described above in conjunction with FIG. 7C.

Figure 16:
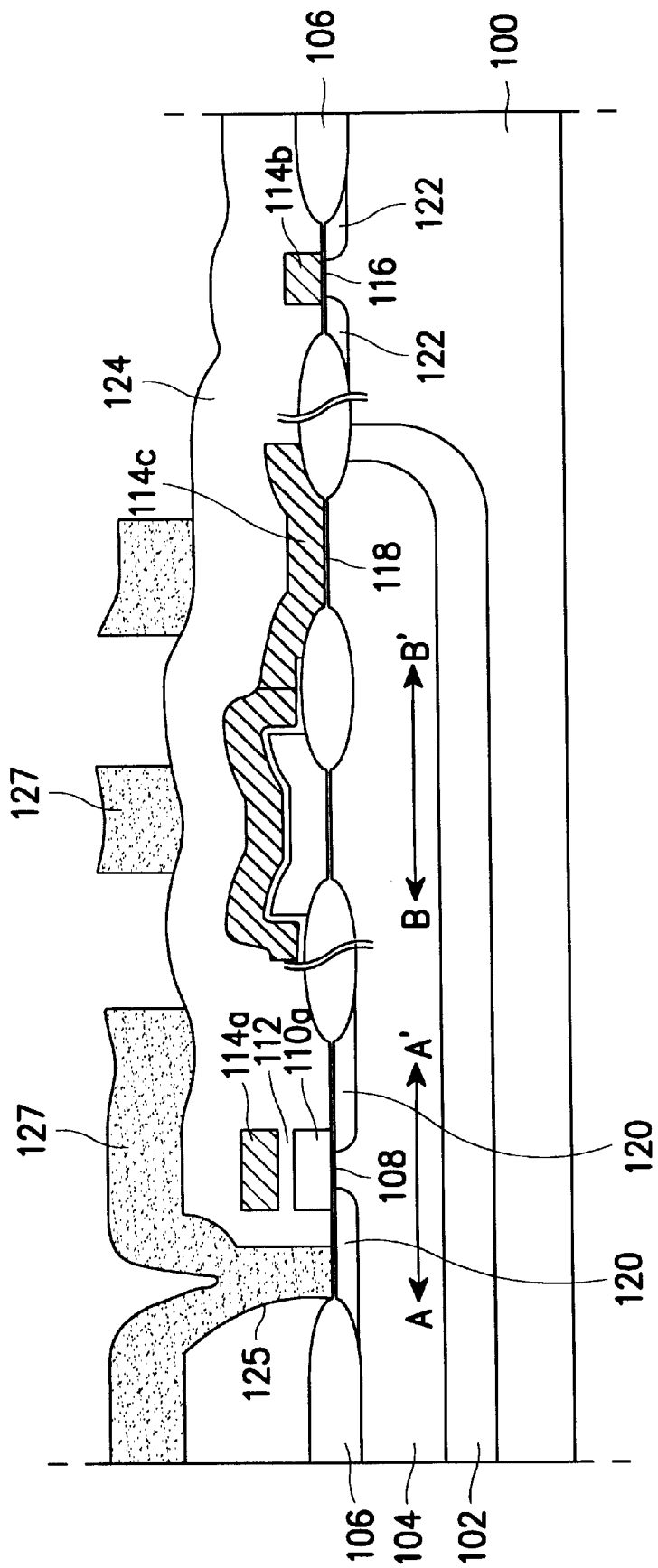

FIG. 16 shows the step of forming first and second source/drain regions 120 and 122, and a metal layer 127. After the formation of the stacked gate 110a and 114a of the cell, and the gate 114a of the source select transistor, the first source/drain regions 120 are formed in the cell array to be a general single diffusion (SD) junction or a DD junction by implanting an n-impurity ion. In an alternative embodiment, only one of the first source/drain regions 120 comprises a DD junction structure.

Here, since the source active region is masked by the photoresist pattern 121 during the ion-implantation, the n-impurity is not implanted and a different junction structure, for example, an LDD structure can be formed in the exposed source/drain regions of the source select transistor by an already formed structure pattern in the peripheral circuit region. In addition, implantation of an impurity ion for the source/drain in the source select transistor can be implemented simultaneously with that of an impurity for a source/drain 122 in the peripheral circuit transistor.

After ion-implantation of the source/drain, for example, a high temperature oxide (HTO) film and a borophosphosilicate glass (BPSG) film are formed as an insulating layer 124 on the resultant structure to be 1000 Å and 5000 Å thick, respectively. Then, the BPSG film is planarized by reflow at 900° C., and a metal contact 125 is formed by etching the insulating layer 124 by photolithography. Preferably, the metal contact 125 is the bit line contact 128 of FIG. 8 for exposing a drain region of a cell.

Thereafter, the metal layer 127 is formed on the resultant structure having the metal contact 125 formed therein, and patterned by photolithography. Thus, a bit line is formed to be connected to the drain region of the cell via the bit line contact. The metal layer 127 may be formed, for example, of metal silicide or polycide.

Subsequently, the step of forming a metal contact and a metal layer is added when multi-layered interconnections are required and a passivation layer is formed on the resultant structure. Thus, the NOR flash memory device is completed.

According to the NOR flash memory cell of the present invention as described above, a reference voltage (e.g., 0 V) is applied to unselected word lines, while a negative voltage is applied to a word line sharing a source active region with a selected cell among the unselected word lines, during reading, post programming, and programming. That is, unintended current paths through the unselected cells not sharing the source active region with the selected cell are removed with a word line voltage of 0 V during a programming operation, using a source select transistor having a positive threshold voltage +Vth, and a current path through the unselected cell sharing the source active region with the selected cell is removed by applying a negative voltage to the word line of the unselected cell.

Therefore, the problem of overerasure is overcome is an array which consumes the same area as that of a conventional cell array using a source select transistor.

While this invention has been particularly shown and described with references to preferred embodiments thereof, it will be understood by those skilled in the art that various changes in form and details may be made therein without departing from the spirit and scope of the invention as defined by the appended claims.

What is claimed is:

1. A non-volatile memory device comprising:

a plurality of bit lines arranged in parallel at predetermined intervals;

a plurality of word lines arranged perpendicularly to the bit lines and at predetermined intervals;

a plurality of unit cells having a stacked gate structure including a floating gate a control gate formed in regions where the bit lines and word lines perpendicularly intersect;

a plurality of source lines parallel to the bit lines, for connecting source active regions of cells; each source active region shared by two symmetrical cells connected to a common bit line; and a plurality of source select transistors formed in overlap regions between the source lines and the word lines;

wherein the source select transistors have a single-layer gate structure including a gate insulating layer under the single-layer gate having a thickness of at least as thick as a gate insulating layer under the floating gate of the cell.

2. The non-volatile memory device of claim 1, wherein the active width of the source select transistor is approximately equal to or larger than that of the cell.

3. The non-volatile memory device of claim 1, further comprising first source/drain junctions aligned to the single-layer gate of the source select transistor and second source/drain junctions aligned to the stacked gate of the cell; the first and second source/drain junctions being different in structure.

4. The non-volatile memory device of claim 3, wherein the second source/drain junctions comprise one of a single diffusion (SD) junction and a double diffusion (DD) junction, and wherein the first source/drain junctions comprise one of an SD junction and a lightly doped drain (LDD) junction.

5. The non-volatile memory device of claim 3, wherein at least one of the first source/drain junctions has the same structure as that of source/drain junctions in a peripheral circuit transistor for driving the cell.

6. The non-volatile memory device of claim 1, wherein the source active region is divided into units of less than the number of cells in a word line direction and more than the number of input/output (I/O) terminals.

7. A method of operating a non-volatile memory device having a plurality of bit lines arranged in parallel at predetermined intervals, a plurality of word lines arranged perpendicularly to the bit lines and at predetermined intervals, a plurality of unit cells having a stacked gate structure including a floating gate and a control gate formed in regions where the bit lines and word lines perpendicularly intersect, a plurality of source lines parallel to the bit lines for connecting source active regions of cells to one another, source active regions shared by two symmetrical cells being connected to a common bit line, and a plurality of source select transistors formed in overlap regions between the source lines and word lines, said method comprising:

generating a cell current by applying a positive voltage to the corresponding bit line and the corresponding word line of a selected cell and applying a reference voltage lower than the bit line voltage to the corresponding source line, during programming of the selected cell for injecting electrons onto the floating gate thereof; and applying a voltage lower than the reference voltage to a word line of an unselected cell sharing the source active region with the selected cell.

8. The method of claim 7, wherein the reference voltage is one of 0 V and a ground voltage and the voltage lower than the reference voltage is a negative voltage.

9. The method of claim 7, wherein a voltage higher than the threshold voltage of the source select transistor is applied to the word line of the selected cell during the programming operation.

10. The method of claim 7, further comprising the step of precharging the source line during the programming operation.

11. The method of claim 7, further comprising the step of performing a post programming operation for injecting fewer electrons onto the floating gate of the cell than those for the programming operation, wherein a negative voltage lower than a voltage on the word line of the unselected cell is applied to the word line of the unselected cell sharing the source active region with the selected cell.

12. The method of claim 11, wherein a voltage higher than the threshold voltage of the source select transistor is applied to the word line of the selected cell during the post programming operation.

13. The method of claim 11, further comprising the step of precharging the source line during the post programming operation.

14. The method of claim 7, wherein the initial threshold voltage of the source select transistor is lower than that of the cell.

15. A method of operating a non-volatile memory device having a plurality of bit lines arranged in parallel at predetermined intervals, a plurality of word lines arranged perpendicularly to the bit lines and at predetermined intervals, a plurality of unit cells having a stacked gate structure including a floating gate and a control gate formed in regions where the bit lines and word lines perpendicularly intersect, a plurality of source lines parallel to the bit lines, for connecting source active regions of cells to one another, source active regions shared by two symmetrical cells being connected to a common bit line, and a plurality source select transistors formed in overlap regions between the source lines and word lines, the method comprising:

applying a positive voltage to the corresponding bit line and the corresponding word line of a selected cell and applying a reference voltage lower than the bit line voltage to the corresponding source line during reading of the selected cell; and applying a voltage lower than the reference voltage to a word line of an unselected cell sharing the source active region with the selected cell.

16. The method of claim 15, wherein the reference voltage is one of 0 V and a ground voltage and the voltage lower than the reference voltage is a negative voltage.

17. The method of claim 15, wherein a voltage higher than the threshold voltage of the source select transistor is applied to the word line of the selected cell during the reading operation.

* * * * *